US009852867B2

(12) United States Patent
Tsuboi et al.

(10) Patent No.: US 9,852,867 B2
(45) Date of Patent: Dec. 26, 2017

(54) CURRENT SENSOR

(71) Applicant: FUJITSU LIMITED, Kawasaki-shi, Kanagawa (JP)

(72) Inventors: Osamu Tsuboi, Kawasaki (JP); Hiromitsu Soneda, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 19 days.

(21) Appl. No.: 14/560,258

(22) Filed: Dec. 4, 2014

(65) Prior Publication Data

US 2015/0084723 A1   Mar. 26, 2015

Related U.S. Application Data

(63) Continuation of application No. PCT/JP2012/065008, filed on Jun. 12, 2012.

(51) Int. Cl.
*H01H 71/24* (2006.01)
*G01R 15/18* (2006.01)
*H01H 47/04* (2006.01)

(52) U.S. Cl.
CPC ....... *H01H 71/2454* (2013.01); *G01R 15/183* (2013.01); *H01H 47/04* (2013.01); *H01H 2047/046* (2013.01)

(58) Field of Classification Search
CPC .. G01R 15/183; H01H 71/2454; H01H 47/04; H01H 2047/046
See application file for complete search history.

(56) References Cited

U.S. PATENT DOCUMENTS

| 1,345,450 A | * | 7/1920 | Larsen | H01H 71/2472 335/103 |
| 1,701,634 A | * | 2/1929 | Putt | H01H 47/04 29/DIG. 81 |
| 3,302,142 A | * | 1/1967 | Piechotta | B23K 9/1031 335/128 |
| 3,497,841 A | * | 2/1970 | Marvin | H01H 51/01 335/179 |

(Continued)

FOREIGN PATENT DOCUMENTS

| CN | 201298512 | 8/2009 |
| CN | 102420048 | 4/2012 |

(Continued)

OTHER PUBLICATIONS

CNOA—The First Notification of Office Action dated Jan. 21, 2016 and the Search Report attached thereto with English translations issued in corresponding Chinese Patent Application No. 201280073867.9.

(Continued)

*Primary Examiner* — Mohamad Musleh
(74) *Attorney, Agent, or Firm* — Fujitsu Patent Center

(57) ABSTRACT

A downsized current sensor with a switch function is disclosed. The current sensor includes: a magnetic circuit to converge a magnetic flux generated from an electric circuit at a magnetic sensor; a switch to open and close the electric circuit in a way that operates together with a movable magnetic body configuring a part of the magnetic circuit; and a magnetizing coil to generate magnetic force enabling the movable magnetic body to be attracted to a fixed magnetic body configuring a part of the magnetic circuit.

8 Claims, 13 Drawing Sheets

(56) References Cited

U.S. PATENT DOCUMENTS

| | | | | |
|---|---|---|---|---|
| 3,534,307 | A | * 10/1970 | Bratkowski | H01H 51/01 335/170 |
| 3,950,718 | A | * 4/1976 | Nagamoto | H01H 51/01 335/234 |
| 5,040,089 | A | * 8/1991 | Sasaki | H01H 47/04 219/722 |
| 6,252,389 | B1 | 6/2001 | Baba et al. | |
| 6,300,733 | B1 | * 10/2001 | Bergstrom | H01F 7/1844 318/128 |
| 6,845,001 | B1 | * 1/2005 | Kinbara | H01F 7/1844 361/152 |
| 2001/0028291 | A1 | * 10/2001 | Nobutoki | H01H 51/2272 335/78 |
| 2005/0073294 | A1 | * 4/2005 | Baxter | G01R 15/183 324/117 R |
| 2010/0165535 | A1 | 7/2010 | Pohl | |

FOREIGN PATENT DOCUMENTS

| | | | | |
|---|---|---|---|---|
| DE | 19609608 | A1 * | 9/1997 | ........... H01H 47/002 |
| GB | 195340 | A * | 10/1923 | ............. H01H 71/24 |
| GB | 225963 | A * | 12/1924 | ......... H01H 71/2418 |
| JP | 8-304479 | | 11/1996 | |
| JP | 11-265649 | | 9/1999 | |
| JP | 11-313441 | | 11/1999 | |
| JP | 2000-322996 | | 11/2000 | |
| JP | 2004-020460 | | 1/2004 | |
| JP | 2005-345446 | | 12/2005 | |
| JP | 2009-521074 | | 5/2009 | |

OTHER PUBLICATIONS

International Search Report, mailed in connection with PCT/JP2012/065008 and dated Jul. 10, 2012.

* cited by examiner

CURRENT SENSOR

CROSS-REFERENCE TO RELATED APPLICATION

This application is a continuation application of International Application PCT/JP2012/065008, filed on Jun. 12, 2012, and designated the U.S., the entire contents of which are incorporated herein by reference.

FIELD

The present application relates to a current sensor.

BACKGROUND

Some of electric apparatuses are equipped with a function to detect an electric current and a function to cut off the electric current. Atypical example of the electric apparatus equipped with the function to detect the electric current and the function to cut off the electric current is exemplified by an overcurrent relay (refer to, e.g., Patent document 1).

Further, in recent years, there has been a request for reducing a power consumption due to a rise in demand for electric power and in terms of taking into consideration the terrestrial environment. One of schemes for reducing the power consumptions is exemplified by visualization of the power consumption of the electric apparatus for a user. Information on the power consumption of the electric apparatus enables an efficient operation of the electric apparatus to be actualized. For example, in the case of an office, the information on the power consumption of an OA (Office Automation) apparatus is useful in terms of settling upon a plan for implementing an efficient work. This being the case, such an attempt has been made that, e.g., current sensors are installed in a distribution switchboard and a table tap, and the respective electric apparatuses are controlled corresponding to the power consumptions of the electric apparatuses connected to subordinate components of the distribution switchboard and the table tap (refer to, e.g., Patent document 2).

PATENT DOCUMENT

[Patent document 1] Japanese Patent Application Laid-Open Publication No. 2005-345446
[Patent document 2] Japanese Patent Application Laid-Open Publication No. H11-313441

SUMMARY

The present application discloses a current sensor which follows. The current sensor includes: a magnetic circuit to converge a magnetic flux generated from an electric circuit at a magnetic sensor; a switch to open and close the electric circuit in a way that operates together with a movable magnetic body configuring a part of the magnetic circuit; and a magnetizing coil to generate magnetic force enabling the movable magnetic body to be attracted to a fixed magnetic body configuring a part of the magnetic circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 15 is one example of a top view of the current sensor according to a fifth modified example.

DESCRIPTION OF EMBODIMENTS

An embodiment of the present disclosure will hereinafter be described. The following embodiment is an exemplification of one aspect of the disclosure of the present application, but does not limit the technical scope of the disclosure of the present application to the aspect that will be given below.

Embodiment

Figure 1:
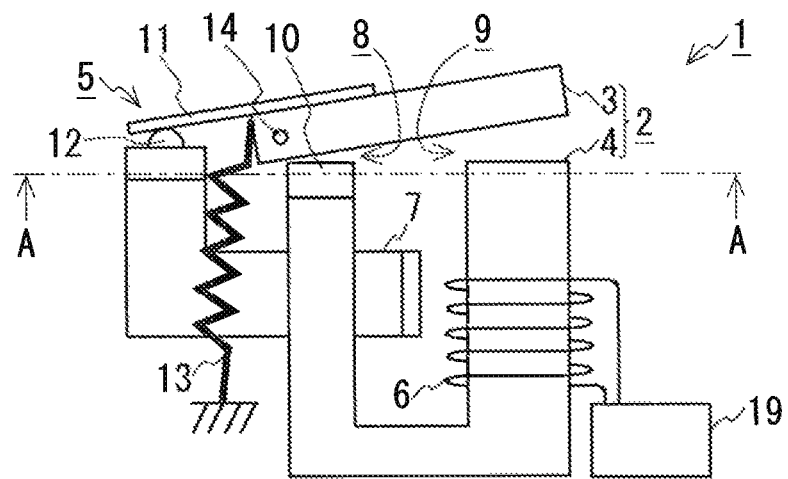
FIG. 1 is one example of a diagram illustrating a current sensor according to an embodiment.

FIG. 1 is one example of a diagram illustrating the current sensor according to the embodiment. A current sensor 1 according to the embodiment includes movable and fixed magnetic bodies 3 and 4 that configure a magnetic circuit 2, a switch 5 operating together with the movable magnetic body 3, and a magnetizing coil 6 fitted to the fixed magnetic body 4.

The current sensor 1 manages a function to measure an electric current of an electric circuit 7. To be specific, in the current sensor 1, the movable magnetic body 3 and the fixed magnetic body 4 configure the magnetic circuit 2 in a way that surrounds the electric circuit 7. Hence, magnetic fluxes generated from the electric circuit 7 converge at the magnetic circuit 2. Further, magnetic fields each having an intensity proportional to the electric current of the electric circuit 7 occur in gaps 8, 9 between the fixed magnetic body 4 and the magnetic circuit 2. Thereupon, in the current sensor 1, a magnetic field sensor 10 disposed in the gap 8 between the movable magnetic body 3 and the fixed magnetic body 4 detects the electric current of the electric circuit 7. Note that the movable magnetic body 3 and the fixed magnetic body 4 involve using preferably a magnetic body such as ferrite, which is small both in magnetic permeability and in coercive force, in order to restrain a hysteresis affecting a measurement of the electric current. Further, the magnetic sensor 10 is disposed in the gap 8 closer to a fulcrum 14 of the movable magnetic body 3 than the gap 9 so as not to receive a mechanical impact when the movable magnetic body 3 moves. This contrivance reduces a possibility that the magnetic sensor 10 is to be damaged. The magnetic sensor 10 may, however, be disposed in the gap 9.

Furthermore, the current sensor 1 manages a function to open and close the electric circuit 7. To be specific, in the current sensor 1, the switch 5 operating together with the movable magnetic body 3 is fitted to a midway of the electric circuit 7. In the switch 5, a movable contact point 11 operating together with the movable magnetic body 3 rotatable about the fulcrum 14 moves and is thereby brought into contact with or separated from a fixed contact point 12. The movable contact point 11 is biased by a tension spring 13 in such a direction as to contact the fixed contact point 12. Further, the movable magnetic body 3 is biased in a direction that is separated from the fixed magnetic body 4. The movable contact point 11 is enabled to move by controlling the electric current flowing to the magnetizing coil 6 wound on the fixed magnetic body 4. For example, when magnetic attraction generated in the gap 9 by the magnetizing coil 6 magnetizing the magnetic circuit 2 exceeds a tension of the tension spring 13, the movable magnetic body 3 is attracted to the fixed magnetic body 4. Moreover, when the movable magnetic body 3 is attracted to the fixed magnetic body 4, the movable contact point 11 is separated from the fixed contact point 12. Note that a rotation mechanism using a pin and a sleeve or a rotation mechanism using a bending spring can be applied to the fulcrum 14. Further, the magnetizing coil 6 may be fitted not to the fixed magnetic body 4 but to the movable magnetic body 3.

Figure 2:
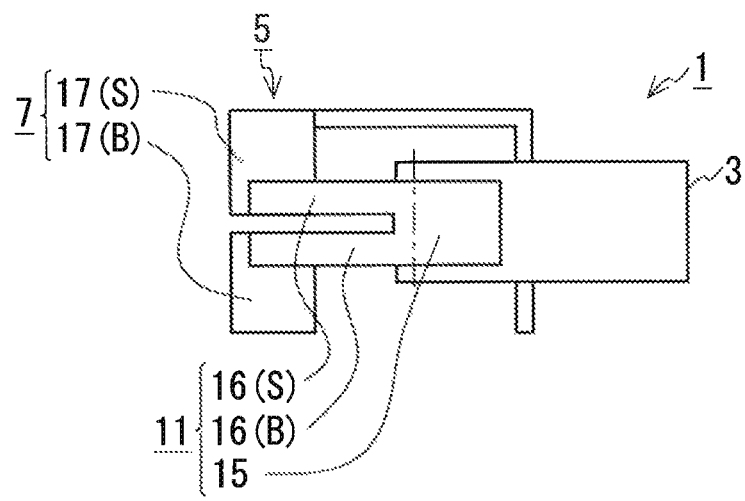
FIG. 2 is one example of a top view of the current sensor.
Figure 3:
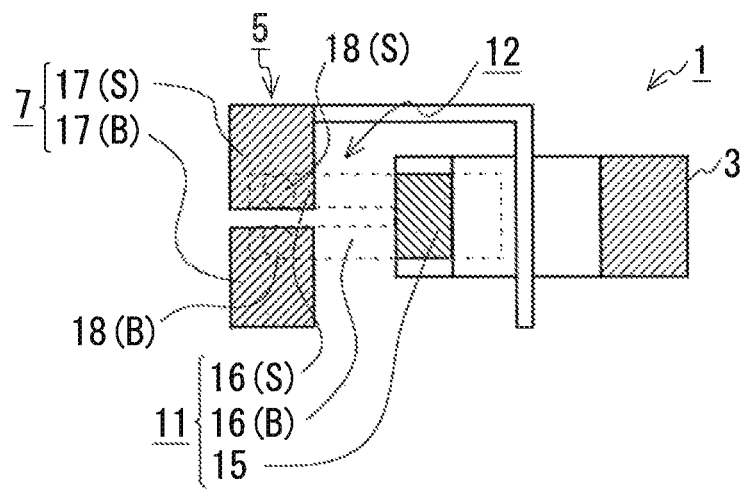
FIG. 3 is one example of a sectional view taken when the current sensor is cut along the line A-A in FIG. 1.

FIG. 2 is one example of a top view of the current sensor 1. Further, FIG. 3 is one example of a sectional view taken when the current sensor 1 is cut off along the line A-A in FIG. 1. The movable contact point 11 includes a proximal portion 15 fixed to the movable magnetic body 3, and contact portions 16(B), 16(S) extending in fork-form from the proximal portion 15. Further, the fixed contact point 12 includes a contacted portion 18(B) provided in a bus bar 17(B) on the side of a bus connected to a power source, and a contacted portion 18(S) provided in a bus bar 17(S) on the side of a branch connected to a load and surrounded by the movable magnetic body 3 and the fixed magnetic body 4. When the movable contact point 11 is brought into contact with the fixed contact point 12, a contacting portion 16(B) contacts the contacted portion 18(B), and a contacting portion 16(S) contacts the contacted portion 18(S). When the contacting portion 16(B) contacts the contacted portion 18(B) and when the contacting portion 16(S) contacts the contacted portion 18(S), the bus bar 17(S) is electrically connected to the bus bar 17(B) via the movable contact point 11.

The movable contact point 11 is configured to extend the contacting portion 16(B) and the contacting portion 16(S) in the folk form from the proximal portion 15, thereby separating a portion contacting the contacted portion 18(B) and a portion contacting the contacted portion 18(S) from each other and thus preventing the electrical contact from becoming defective due to a tolerance etc in dimension between the respective contact points. The switch 5 is not, however, limited to such a mode. Namely, the switch 5 may be configured, e.g., so that the bus bar 17(S) is connected to the power source, while the bus bar 17(B) is connected to the load. Furthermore, the switch 5 may also be configured, e.g., so that the movable contact point 11 is connected directly to the load or the power source via an elastically deformable cable. When the movable contact point 11 is connected directly to the load or the power source, it is feasible to omit one of the two contacting portions 16(B), 16(S) provided in the movable contact point 11 and one of the two contacted portions 18(B), 18(S) provided in the fixed contact point 12, respectively.

Figure 4:
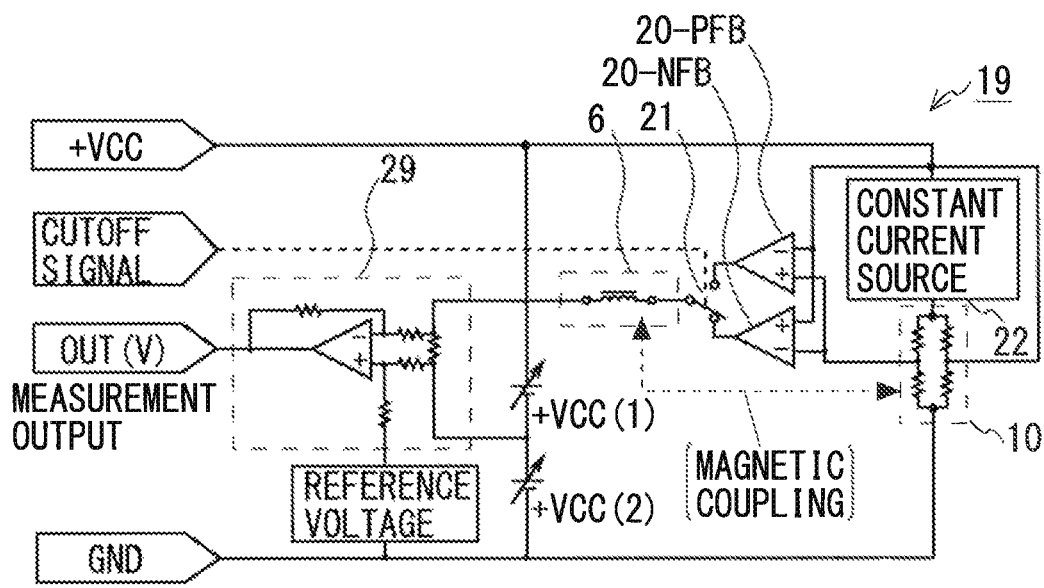
FIG. 4 is a first example of a diagram of a configuration of a control circuit.

The current sensor 1 connects a control circuit 19, which will be described below, to the magnetizing coil 6 and is thereby enabled to manage a function to measure the electric current of the electric circuit 7 and a function to open and close the electric circuit 7. FIG. 4 is a first example of a diagram of a configuration of the control circuit 19.

The control circuit 19 is a circuit for detecting the electric current based on a magnetic balance system. To be specific, the control circuit 19 includes: a constant current source 22 that supplies drive power to a Hall element built in the magnetic field sensor 10; and an amplifier 20-NFB (Negative Feed Back) that performs negative feedback control of the electric current of the magnetizing coil 6 so that a Hall voltage becomes zero. Note that a magnetic resistance element serving as a substitute for the Hall element may be built in the magnetic sensor 10. When the amplifier 20-NFB performs the negative feedback control of the electric current of the magnetizing coil 6 so that the Hall voltage becomes zero, magnetism of the magnetic circuit 2 is cancelled so as to zero a density of the magnetic flux passing through the magnetic sensor 10. Hence, the control circuit 19 converts the electric current of the magnetizing coil 6 in a magnetic balance state into a measurement voltage by use of a current-voltage converting circuit 29, thereby enabling a measurement signal of the electric current flowing through the electric circuit 7 to be output with high accuracy.

Further, the control circuit 19 includes: an amplifier 20-PFB (Positive Feed Back) that performs positive feedback control of the electric current of the magnetizing coil 6 to amplify the Hall voltage; and a selector switch 21 to switch over the amplifier to be operation on the basis of a cutoff signal inputted from outside. When the amplifier 20-PFB performs the positive feedback control of the electric current of the magnetizing coil 6 to amplify the Hall voltage, the density of the magnetic flux passing through the gap 9 rises. When the magnetic attraction in the gap 9 exceeds the tension of the tension spring 13, the movable magnetic body 3 is attracted to the fixed magnetic body 4, while the movable contact point 11 is separated from the fixed contact point 12.

Figure 5:
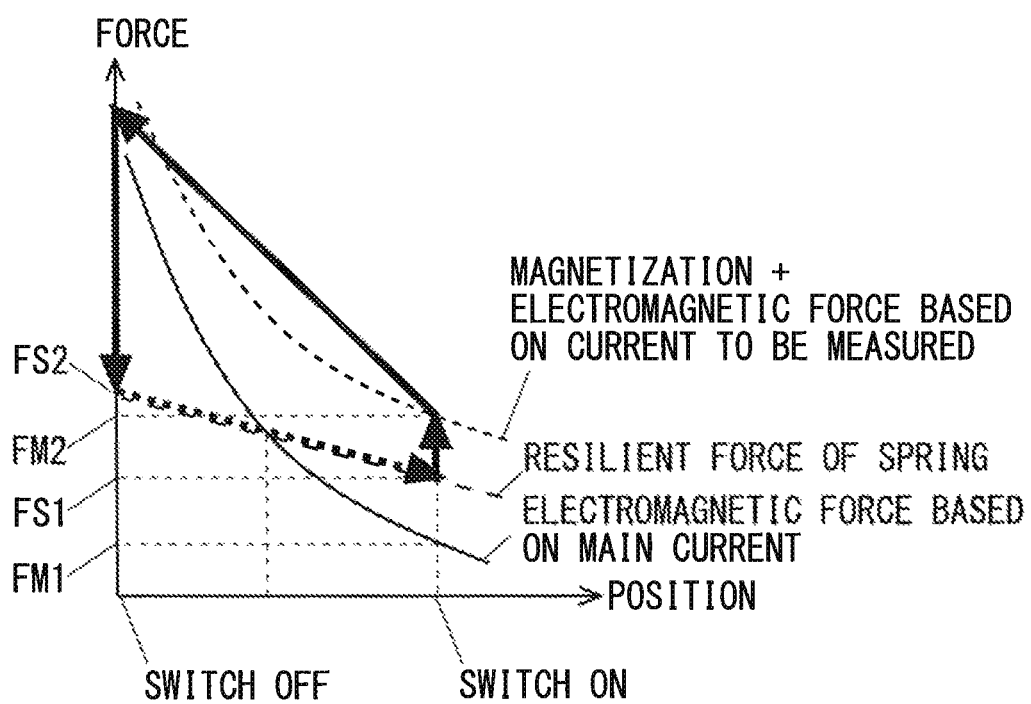
FIG. 5 is one example of a graph representing a relationship between a position of a movable magnetic body and force acting on the movable magnetic body.

FIG. 5 is one example of a graph representing a relationship between a position of the movable magnetic body 3 and force acting on the movable magnetic body 3. The control circuit 19 is connected to the magnetizing coil 6 of the current sensor 1 described above, in which state the cutoff signal to be inputted to the control circuit 19 is stopped when desiring to switch ON the electric circuit 7. When stopping the cutoff signal to be inputted to the control circuit 19, the positive feedback control by the amplifier 20-PFB is stopped, while the negative feedback control by the amplifier 20-NFB is started. The negative feedback control by the amplifier 20-NFB causes a decrease in density of the magnetic flux of the magnetic circuit 2, and the magnetic attraction reduces under the tension of the tension spring 13, at which time the movable magnetic body 3 is pulled away from the fixed magnetic body 4. When the movable magnetic body 3 is pulled away from the fixed magnetic body 4 and when the movable contact point 11 reaches the contact with the fixed contact point 12, the power source starts supplying the electricity to the load. Further, the negative feedback control of the amplifier 20-NFB causes the magnetic circuit 2 to reach the balance state, and thereupon the measurement signal corresponding to the electric current flowing through the electric circuit 7 is output from the control circuit 19.

Moreover, the control circuit 19 is connected to the magnetizing coil 6 of the current sensor 1 described above, in which state when desiring to switch OFF the switch 5, the cutoff signal is inputted to the control circuit 19. When the cutoff signal is inputted to the control circuit 19, the negative feedback control by the amplifier 20-NFB is stopped, while the positive feedback control by the amplifier 20-PFB is started. The positive feedback control by the amplifier 20-PFB causes the rise in density of the magnetic flux of the magnetic circuit 2, and, when the attraction of the magnetic force exceeds the tension of the tension spring 13, the movable magnetic body 3 is attracted to the fixed magnetic body 4. When the movable magnetic body 3 is attracted to the fixed magnetic body 4 and when the movable contact point 11 is separated from the fixed contact point 12, the power source stops supplying the electricity to the load.

The current sensor 1 described above can, when provided, manage both of the function to detect the electric current and the function to cut off the electric current, and is therefore capable of reducing an installation space to a greater degree than in the case of incorporating a separate current sensor and a current cutoff unit into one single electric appliance.

Furthermore, the current sensor 1 described above being provided, when measuring the electric current of the electric circuit 7, the movable magnetic body 3 is mechanically static without depending on the electric current of the electric circuit 7. Hence, there are restrained non-linearity of the magnetic flux density with respect to the electric current of the electric circuit 7 and a resonance of the movable magnetic body 3, the resonance being caused by external vibrations, and influence exerted on the accuracy of measuring the electric current is also restrained. As a result, the electric current of the electric circuit 7 can be measured with the high accuracy.

Further, the control circuit 19 is configured such that the positive feedback control is performed upon switching OFF the switch 5, the current of the magnetic field flows to the magnetizing coil 6 to further intensify the magnetic force generated in the magnetic circuit 2 by dint of the electric current flowing through the electric circuit 7, thus compensating a deficiency of the magnetic force to move the movable magnetic body 3. Hence, the current sensor 1 uses the magnetic body exhibiting the small hysteresis and the small magnetic permeability in order to enhance the accuracy of measuring the electric current, and is also capable of moving the movable magnetic body 3 with the magnetizing coil 6 irrespective of the existence of the gap in which to install the magnetic field sensor 10.

Note that the current sensor 1 can measure a value of the electric current regardless of whether the electric current flowing through the electric circuit 7 is an alternating current or a direct current. In the case of the alternating current, however, electromagnetic force decreases in the vicinity of a zero cross point, and it is therefore desirable that the electric current of the magnetizing coil on the occasion of switching OFF the switch 5 is designed based not on a peak value but on an average value.

Modified Example 1 of Control Circuit

Figure 6:
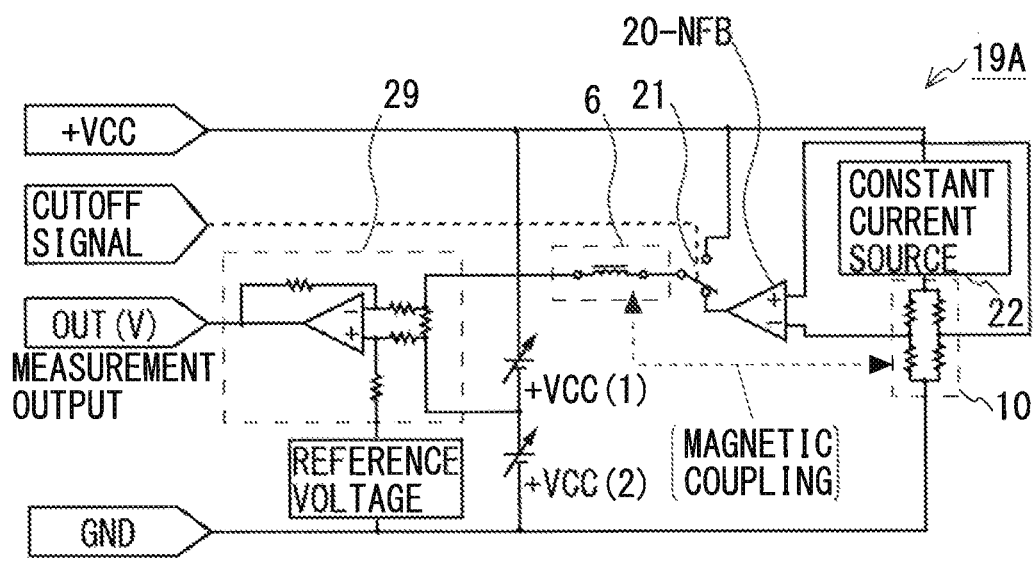
FIG. 6 is one example of a diagram of a configuration of a control circuit according to a modified example in which the control circuit is modified.

FIG. 6 is one example of a diagram of a configuration according to a modified example given when the control circuit 19 is modified. A control circuit 19A according to the modified example 1 is configured to omit the amplifier 20-PFB equipped in the control circuit 19. Then, when the cutoff signal is inputted from outside, the amplifier 20-NFB performing the negative feedback control is stopped, and a fixed voltage is applied to the magnetizing coil 6. The configuration of the control circuit 19A other than the points described above is the same as the configuration of t the control circuit 19.

The current sensor 1 can manage the function to measure the electric current of the electric circuit 7 and the function to open and close the switch in the same way with the control circuit 19 even when the control circuit 19A according to the modified example 1 is connected to the magnetizing coil 6.

First Modified Example of Current Sensor

Figure 7:
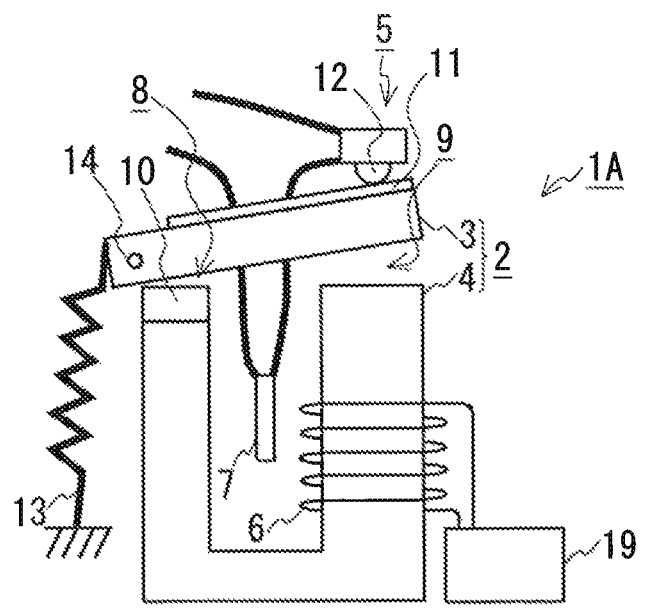
FIG. 7 is one example of a diagram illustrating the current sensor according to a first modified example.

FIG. 7 is one example of a diagram illustrating the current sensor according to a first modified example. A current sensor 1A according to the first modified example is configured so that the switch 5 is fitted not to the opposite side of the movable magnetic body 3 but to an upper side of the movable magnetic body 3, with the fulcrum 14 being interposed therebetween.

The current sensor 1A according to the first modified example can manage, in the same way as the current sensor 1 does, the function to measure the electric current of the electric circuit 7 and the function to open and close the electric circuit 7 by connecting the control circuit 19 described above to the magnetizing coil 6.

Second Modified Example of Current Sensor

Figure 8:
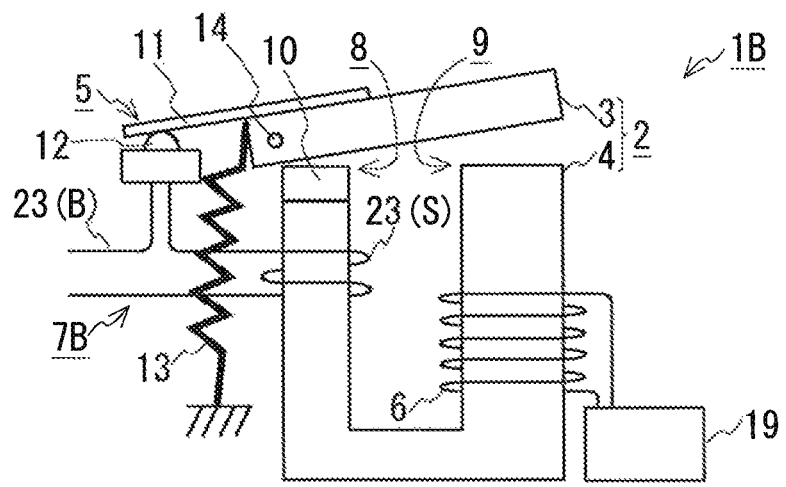
FIG. 8 is one example of a diagram illustrating the current sensor according to a second modified example.

FIG. 8 is one example of a diagram illustrating the current sensor according to a second modified example. A current sensor 1B according to the second modified example is configured such that an electric circuit 7B to measure the electric current is built up not by the bus bar but by cables. Namely, the electric circuit 7B is built by a cable 23(B) on the side of the bus connected to the power source and by a cable 23(S) on the side of the branch connected to the load. Moreover, the cable 23(S) is wound on the fixed magnetic body 4. The number of windings of the cable 23(S) wound on the fixed is properly determined corresponding to the number of windings etc of the magnetizing coil 6 so that the magnetism converging at the magnetic circuit 2 built up by the fixed magnetic body 4 and the movable magnetic body 3 comes to have a proper magnetic flux density. The configuration other than the points described above is the same as the configuration of the current sensor 1.

The current sensor 1B according to the second modified example can manage, in the same way as the current sensor 1 does, the function to measure the electric current of the electric circuit 7B and the function to open and close the electric circuit 7B by connecting the control circuit 19 described above to the magnetizing coil 6. Note that in the case of the current sensor 1B, the density of the magnetic flux generated in the magnetic circuit 2 by dint of the electric current of the electric circuit 7B is approximately proportional to the number of windings of the electric circuit 7B. Hence, it follows that a sufficient number of windings of the magnetizing coil 6 is also ensured, or alternatively the control circuit 19B is provided with a sufficient capacity of supplying the electric current. However, the current sensor 1B according to the second modified example can, when provided, increase sensitivity of the sensor and reduce the influence etc of noises of the magnetic field from outside.

Third Modified Example of Current Sensor

Figure 9:
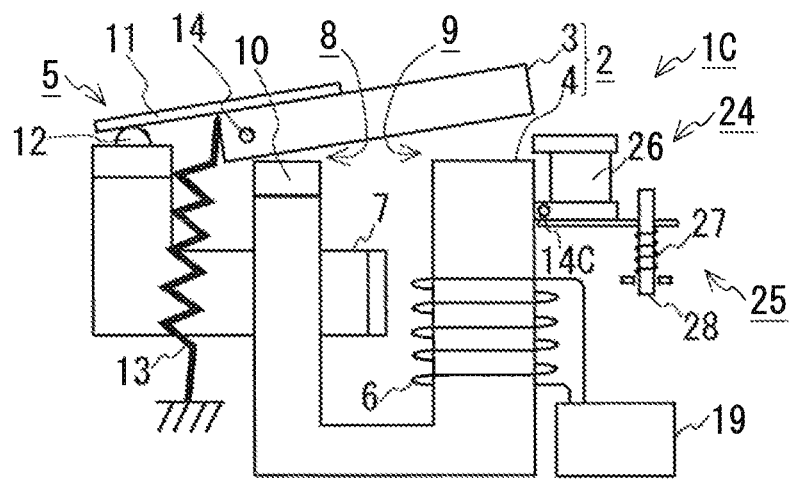
FIG. 9 is one example of a diagram illustrating the current sensor according to a third modified example.

FIG. 9 is one example of a diagram illustrating the current sensor according to a third modified example. A current sensor 1C according to the third modified example includes a latch mechanism 24 and a latch canceling mechanism 25. The latch mechanism 24 retains the state in which the movable magnetic body 3 is attracted to the fixed magnetic body 4 by making use of magnetic force of a permanent magnet.

The latch mechanism 24 includes a permanent magnet 26 fitted to the fixed magnetic body 4 in a state of being rotatable about a fulcrum 14C, and a compression spring 27 to bias the permanent magnet 26 in such a direction as to contact the movable magnetic body 3. The latch canceling mechanism 25 includes a return pin 28 capable of pushing the permanent magnet 26 in such a direction as to be pulled away from the movable magnetic body 3. The permanent magnet 26 applies, to the movable magnetic body 3, the magnetic attraction that is stronger than the force by which the tension spring 13 pulls the movable magnetic body 3 away from the fixed magnetic body 4 when the movable magnetic body 3 is brought into contact therewith. Therefore, the movable magnetic body 3, upon contacting the permanent magnet 26, retains the state of contacting the fixed magnetic body 4 without being pulled away from the fixed magnetic body 4 by the tension spring 13.

The current sensor 1C according to the third modified example can manage the function to measure the electric current of the electric circuit 7 and the function to open the electric circuit 7 by connecting the control circuit 19 described above to the magnetizing coil 6. To be specific, when inputting the cutoff signal to the control circuit 19, the movable magnetic body 3 attracted to the fixed magnetic body 4 is brought into contact with the permanent magnet 26. When the movable magnetic body 3 contacts the permanent magnet 26, the movable magnetic body 3 keeps the state of contacting the fixed magnetic body 4 by dint of the magnetic attraction of the permanent magnet 26. Accordingly, the current sensor 1C according to the third modified example can, when provided, keep the switch 5 in an OFF-state even when stopping the control circuit 19 after switching OFF the switch 5 by inputting the cutoff signal.

Figure 10:
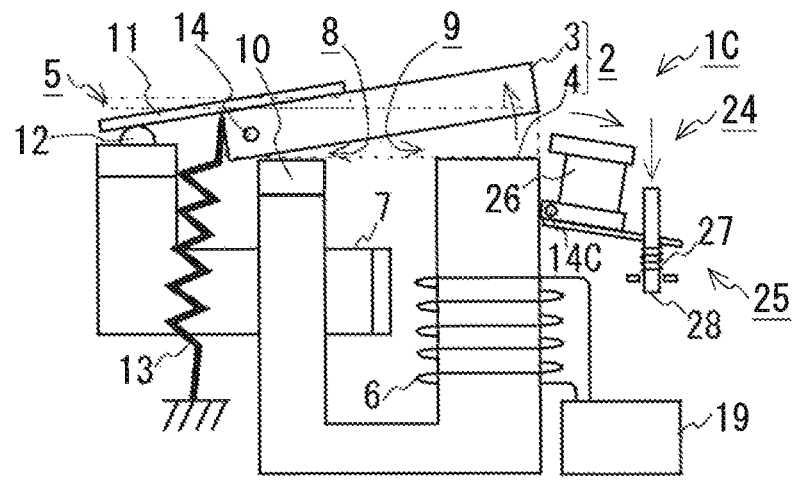
FIG. 10 is one example of a diagram illustrating a state of pushing a return pin.

Further, the current sensor 1C according to the third modified example can switch ON the switch 5 by pushing the return pin 28. FIG. 10 is one example of a diagram illustrating a state of pushing the return pin 28. Upon pushing the return pin 28, the permanent magnet 26 is separated from the movable magnetic body 3. When the permanent magnet 26 is separated from the movable magnetic body 3, the movable magnetic body 3 is biased by the tension spring 13 in the direction that moves away from the fixed magnetic body 4. The pushed return pin 28 is returned to its original position by the compression spring 27.

Fourth Modified Example of Current Sensor

Figure 11:
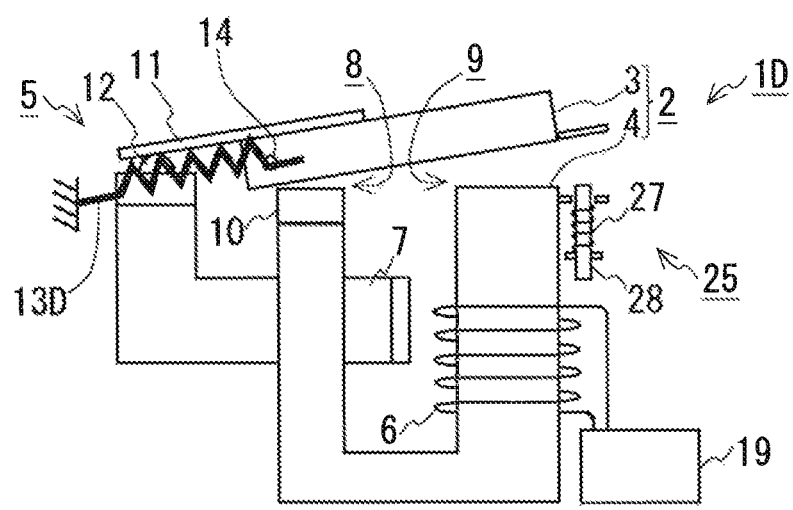
FIG. 11 is one example of a diagram illustrating the current sensor according to a fourth modified example.

FIG. 11 is one example of a diagram illustrating the current sensor according to a fourth modified example. A current sensor 1D according to the fourth modified example is a sensor configured to modify the latch mechanism 24 of the current sensor 1C according to the third modified example, the latch function being given to the tension spring 13.

Figure 12:
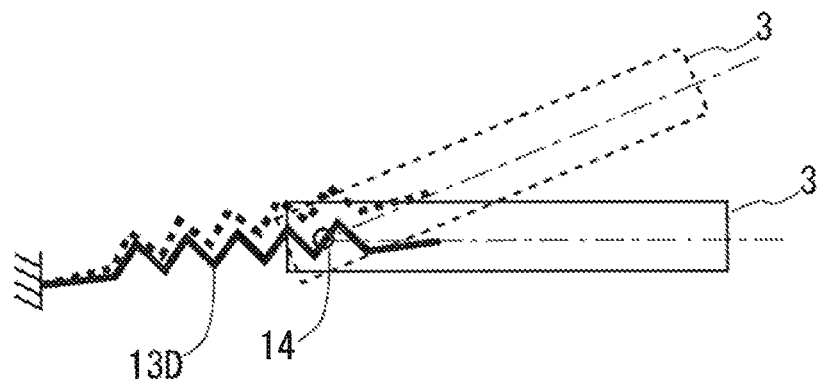
FIG. 12 is one example of a diagram illustrating a tension spring in enlargement.

FIG. 12 is one example of a diagram illustrating a tension spring 13D in enlargement. The tension spring 13D is installed so that the fulcrum 14 is within a movable range of the tension spring 13D. Hence, it follows that an upper dead point of the tension of the tension spring 13D, which is caused when moving the movable magnetic body 3, exists in a middle position between an angle of the movable magnetic body 3 in the state where the movable contact point 11 contacts the fixed contact point 12 and an angle of the movable magnetic body 3 in the state of contacting the fixed magnetic body 4. The upper dead point of the tension of the tension spring 13D exists in the middle position of the movable range of the movable magnetic body 3, and hence a rotation moment applied to the movable magnetic body 3 is reversed at the fulcrum 14 as a boundary. Therefore, the tension spring 13D keeps, when in the state where the movable contact point 11 contacts the fixed contact point 12, this contact state, and also keeps, when in the state where the movable magnetic body 3 contacts the fixed magnetic body 4, this contact state. Accordingly, the current sensor 1D according to the fourth modified example can, when provided, stop the control circuit 19 after switching OFF the switch 5 by inputting the cutoff signal in the same way as the current sensor 1C according to the third modified example does.

Figure 13:
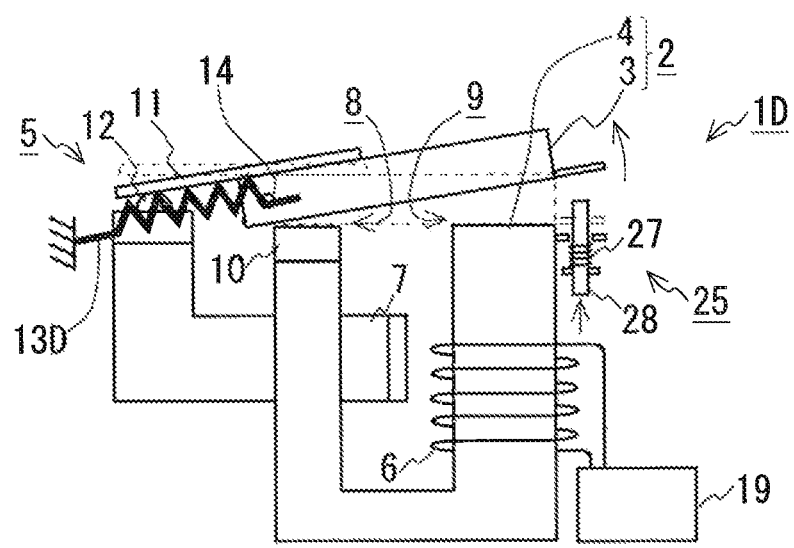
FIG. 13 is one example of a diagram illustrating a state of pushing the return pin.

Further, the current sensor 1D according to the fourth modified example can also close the electric circuit 7 by pushing the return pin 28. FIG. 13 is one example of a diagram illustrating the state of pushing the return pin 28. Upon pushing the return pin 28, the movable magnetic body 3 is pushed away from the fixed magnetic body 4. When the movable magnetic body 3 is pushed by the return pin 28 and passes through the upper dead point of the tension of the tension spring 13D, the movable magnetic body 3 is further biased by the tension spring 13 in the direction of moving away from the fixed magnetic body 4. The pushed return pin 28 is returned to its original position by the compression spring 27.

Figure 14:
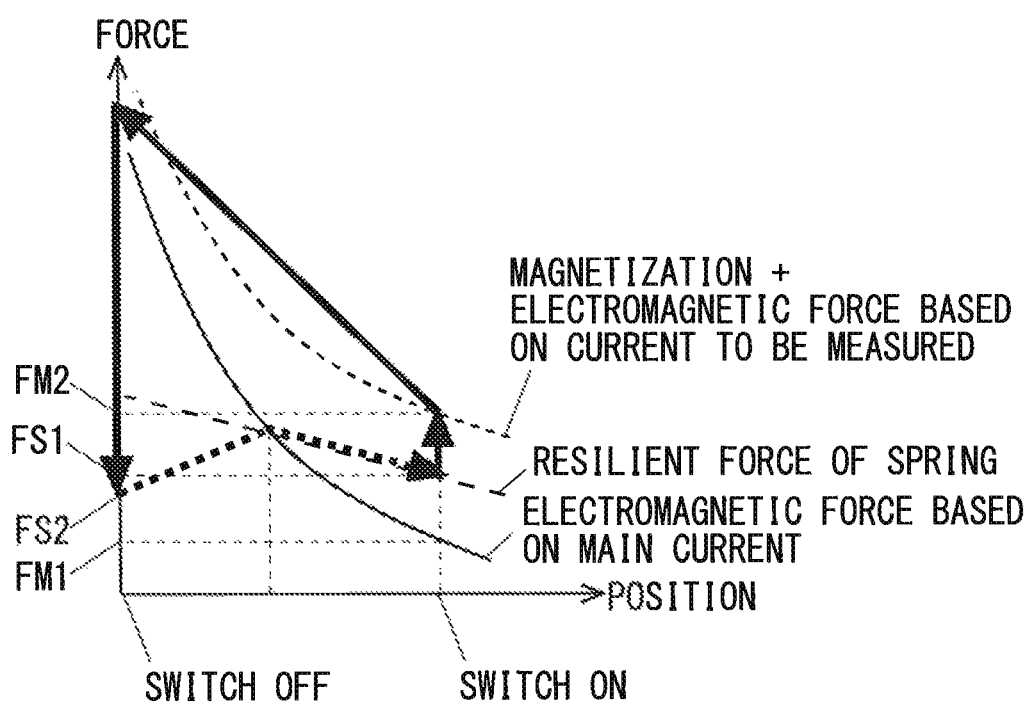
FIG. 14 is one example of a graph representing a relationship between a position of the movable magnetic body and force acting on the movable magnetic body in the current sensor according to the fourth modified example.

FIG. 14 is one example of a graph representing a relationship between a position of the movable magnetic body 3 and force acting on the movable magnetic body 3 in the current sensor 1D according to the fourth modified example. The control circuit 19 is connected to the magnetizing coil 6 of the current sensor 1D described above, in which state the cutoff signal is inputted to the control circuit 19 when desiring to switch OFF the switch 5. Upon inputting the cutoff signal to the control circuit 19, the amplifier 20-PFB starts performing the positive feedback control. When the positive feedback control by the amplifier 20-PFB causes the rise in magnetic flux density of the magnetic circuit 2 and when the magnetic attraction exceeds the tension of the tension spring 13, the movable magnetic body 3 is attracted to the fixed magnetic body 4. When the movable magnetic body 3 is attracted to the fixed magnetic body 4 and when the movable contact point 11 reaches the separation from the fixed contact point 12, the switch 5 is switched OFF. The movable magnetic body 3 passes through the upper dead point of the tension of the tension spring 13D in the course of the movable magnetic body 3 being attracted to the fixed magnetic body 4, at which time, in addition to the magnetic attraction of the magnetizing coil 6, the tension of the tension spring 13D is further applied to the movable magnetic body 3. As a result, the movable magnetic body 3 is kept in the state of being separated away from the fixed magnetic body 4.

Fifth Modified Example of Current Sensor

Figure 15:
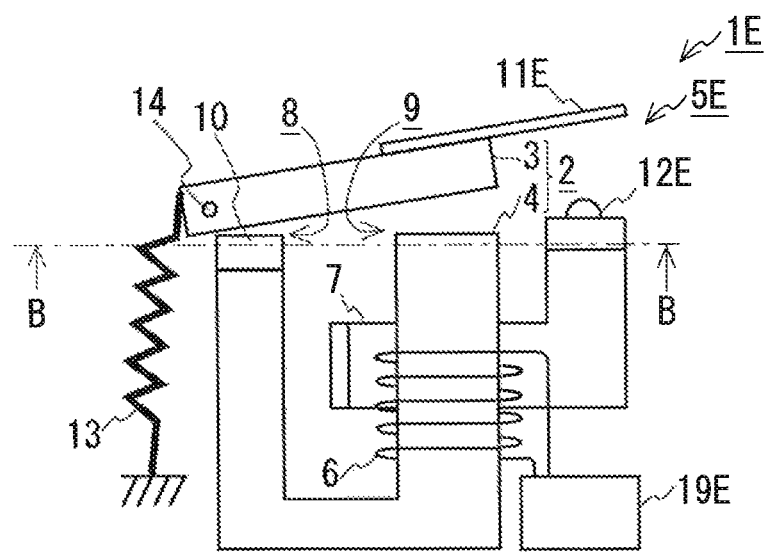
FIG. 15 is one example of a diagram illustrating the current sensor according to a fifth modified example.

FIG. 15 is one example of a diagram illustrating the current sensor according to a fifth modified example. The current sensor according to the embodiment and each of the modified examples (the first through fourth modified examples) described above adopts the switch based on a so-called B-contact (break contract) method. On the other hand, a current sensor 1E according to the fifth modified example adopts a switch 5E based on a so-called A-contact (make contact) method.

To be specific, the current sensor 1E according to the fifth modified example is configured such that a movable contact point 11E is fitted to the opposite side of the tension spring 13, with the fulcrum 14 being interposed therebetween. Hence, the movable contact point 11E is biased by the tension spring 13 in such a direction as to be separated away from a fixed contact point 12E. The movable magnetic body 3 is biased in the direction that moves away from the fixed magnetic body 4 in the same way with the current sensor 1 according to the embodiment. The movable contact point 11E can be moved by controlling the electric current flowing to the magnetizing coil 6. For example, when the magnetic attraction in the gap, which is generated by magnetizing the magnetic circuit 2 with the magnetizing coil 6, exceeds the tension of the tension spring 13E, the movable magnetic body 3 is attracted to the fixed magnetic body 4. When the movable magnetic body 3 is attracted to the fixed magnetic body 4, the movable contact point 11E fitted to the movable magnetic body 3 contacts the fixed contact point 12E.

Figure 16:
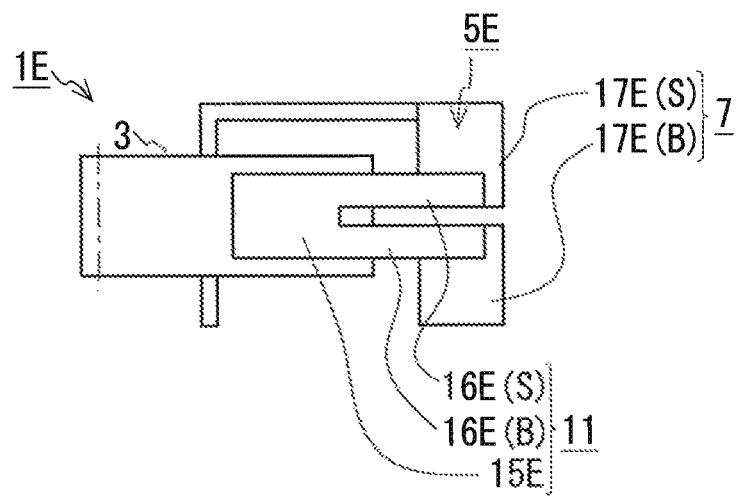
Figure 17:
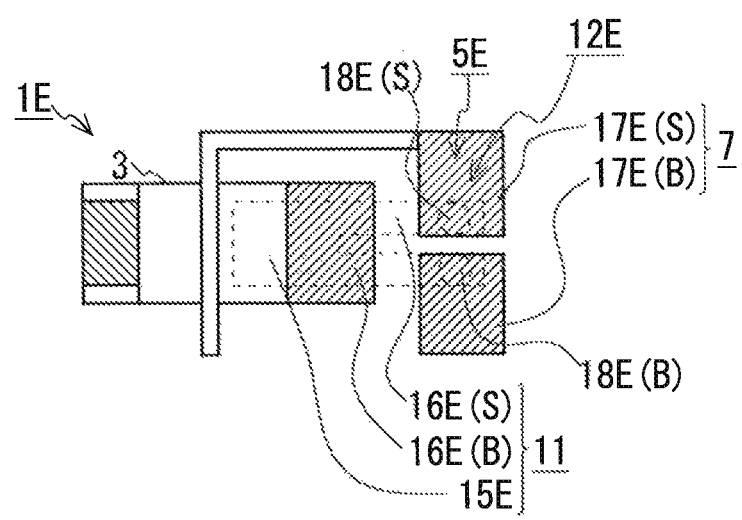
FIG. 17 is one example of a sectional view taken when the current sensor is cut along the line B-B in FIG. 15.

FIG. 16 is one example of a top view of the current sensor 1E according to the fifth modified example. Further, FIG. 17 is one example of a sectional view taken when the current sensor 1E is cut off along the line B-B in FIG. 15. The movable contact point 11E includes a proximal portion 15E fixed to the movable magnetic body 3, and contact portions 16E(B), 16E(S) extending in fork-form from the proximal portion 15E. Furthermore, the fixed contact point 12E includes a contacted portion 18E(B) provided in a bus bar 17E(B) on the side of a bus connected to a power source, and a contacted portion 18E(S) provided in a bus bar 17E(S) on the side of a branch connected to a load and surrounded by the movable magnetic body 3 and the fixed magnetic body 4. When the movable contact point 11E is brought into contact with the fixed contact point 12E, a contacting portion 16E (B) contacts the contacted portion 18E(B), and a contacting portion 16E (S) contacts the contacted portion 18E(S). When the contacting portion 16E (B) contacts the contacted portion 18E(B) and when the contacting portion 16E(S) contacts the contacted portion 18E (S), the bus bar 17E (S) is electrically connected to the bus bar 17E (B) via the movable contact point 11E.

Figure 18:
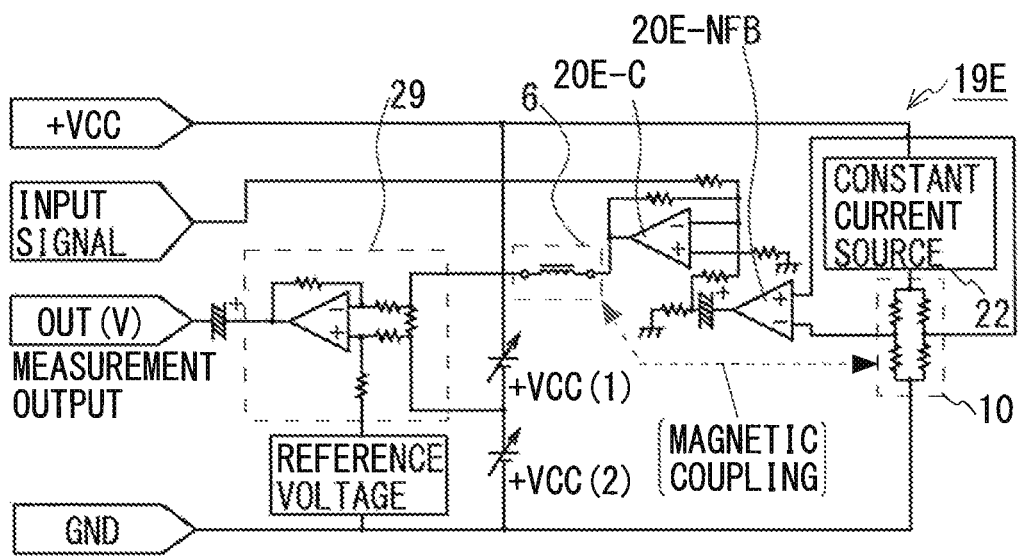
FIG. 18 is a second example of a diagram of a configuration of the control circuit.

The current sensor 1E can manage the function to measure the electric current of the electric circuit 7 and the function to open and close the electric circuit 7 by connecting a control circuit 19E which will be described below to the magnetizing coil 6. FIG. 18 is a second example of a diagram of a configuration of the control circuit 19E.

The control circuit 19E is a circuit for detecting the electric current by the magnetic balance system in the same way as the control circuit 19 does. However, the current sensor 1E according to the fifth modified example employs the switch 5E based on the A-contact method, and it therefore follows that the electric current for attracting the movable magnetic body 3 to the fixed magnetic body 4 flows to the magnetizing coil 6 when measuring the electric current of the electric circuit 7. Such being the case, the control circuit 19E is provided with an amplifier 20E-C to superimpose the electric current with a component of the input signal being amplified in the midway of the circuit leading to the magnetizing coil 6 from an amplifier 20E-NFB performing the negative feedback control of the electric current of the magnetizing coil 6 so that the Hall voltage is zeroed. Hence, the electric current, to which a component of an input signal to be inputted to the control circuit 19E is added in addition to the component for cancelling the magnetic flux generated in the magnetic circuit 2 due to the electric current flowing through the electric circuit 7, flows to the magnetizing coil 6. The control circuit 19E outputs the electric current, from which the component of the input signal is removed, flowing through the magnetizing coil 6, as a measurement signal of the electric current flowing along the electric circuit 7. Note that when the direct current is used as the magnetizing current and when the alternating current is used as the measurement target current, it is feasible to easily remove the DC component of the magnetizing current superimposed on the measurement current defined as the AC component.

Figure 19:
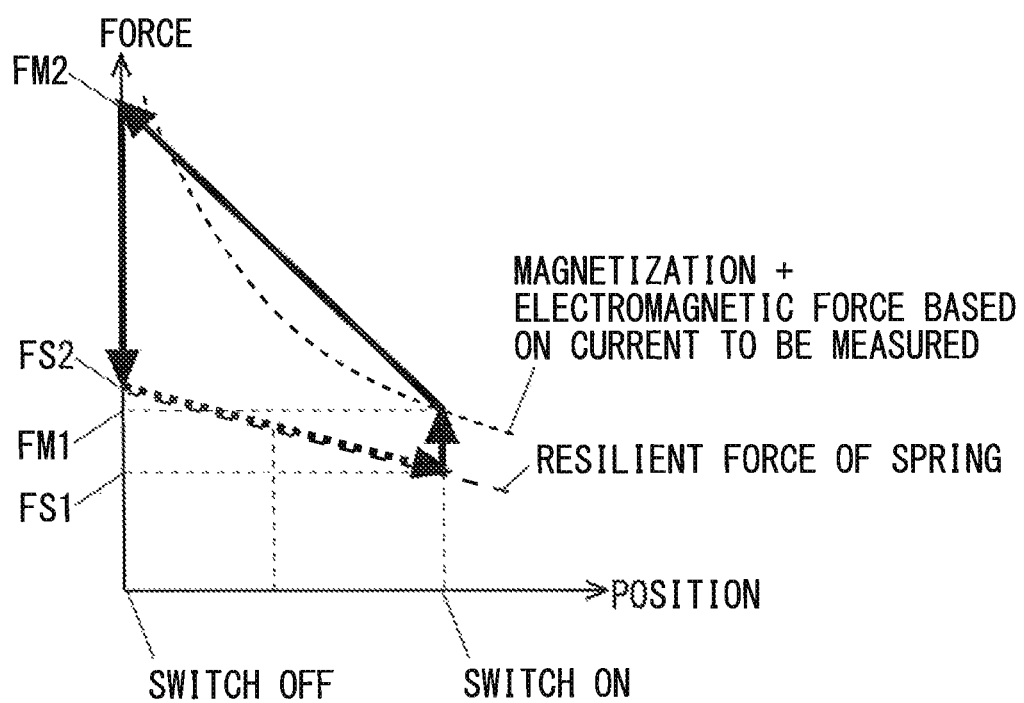
FIG. 19 is one example of a graph representing a relationship between a position of the movable magnetic body and force acting on the movable magnetic body.

FIG. 19 is one example of a graph representing a relationship between a position of the movable magnetic body 3 and force acting on the movable magnetic body 3. The control circuit 19E is connected to the magnetizing coil 6 of the current sensor 1E according to the fifth modified example, in which state the input signal is inputted to the control circuit 19E when desiring to switch ON the switch 5E. Upon inputting the input signal to the control circuit 19, the amplifiers 20E-NFB, 20E-C start performing the negative feedback control, whereby the magnetizing current for attracting the movable magnetic body 3 to the fixed magnetic body 4 flows to the magnetizing coil 6. When the attraction of the magnetism generated by the magnetizing coil 6 in the gap 9 exceeds the tension of the tension spring 13, the movable magnetic body 3 is attracted to the fixed magnetic body 4. When the movable magnetic body 3 is attracted to the fixed magnetic body 4, the movable contact point 11E contacts the fixed contact point 12E, and the switch 5E is switched ON. When the switch 5E is switched ON and when the electric current flows to the electric circuit 7, the measurement signal for the electric current flowing along the electric circuit 7 is output from the control circuit 19E.

Further, the control circuit 19E is connected to the magnetizing coil 6 of the current sensor 1E according to the fifth modified example, in which state when desiring to switch OFF the switch 5E, the input signal is cut off. Upon cutting off the input signal, the amplifiers 20E-NFB, 20E-C stops performing the negative feedback control, thereby cutting off the magnetizing current flowing to the magnetizing coil 6. When cutting off the magnetizing current flowing to the magnetizing coil 6, the movable magnetic body 3 is pulled away from the fixed magnetic body 4 by the tension spring 13E, and the movable contact point 11E is separated from the fixed contact point 12E. When the movable contact point 11E is separated from the fixed contact point 12E, the power source stops supplying the electricity to the load.

Note that the current sensor 1E according to the fifth modified example flows the electric current to the magnetizing coil 6 when switching ON the switch 5E, and generates the electromagnetic force (corresponding to "FM1" in the graph of FIG. 19) stronger than the spring force of the tension spring 13E. The movable magnetic body 3 is thereby attracted to the fixed magnetic body 4. As the gap 9 becomes smaller, the electromagnetic force generated in the gap 9 increasingly becomes stronger. When the gap 9 is minimized, the electromagnetic force generated in the gap 9 is maximized (see "FM2" in the graph of FIG. 19). Upon reaching this state, as far as the electromagnetic force "FM2" exceeds the spring force "FS2", the ON-state of the switch 5E can be maintained even when decreasing a magnitude (level) of the electric current flowing to the magnetizing coil 6. However, it follows that the electric current continuously flows to the magnetizing coil 6.

Modified Example 2 of Control Circuit

Figure 20:
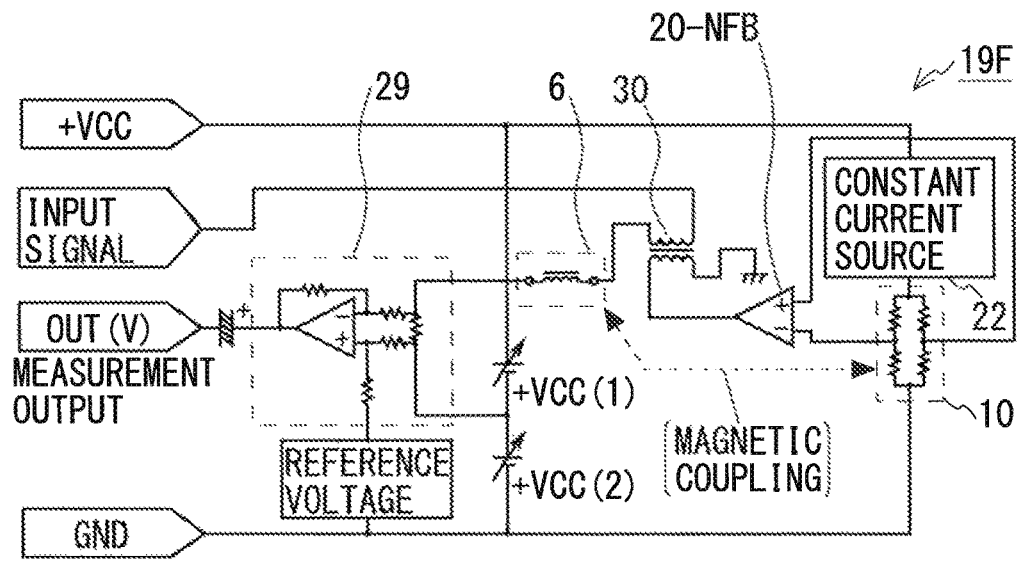
FIG. 20 is one example of a diagram of a configuration of the control circuit according to a modified example in which the control circuit is modified.

FIG. 20 is one example of a diagram illustrating a configuration of the control circuit according to a modified example of modifying the control circuit 19E. A control circuit 19F according to a modified example 2 is provided with a transformer 30 in place of the amplifier 20E-C equipped in the control circuit 19E. Hence, the electric current, to which the component of the input signal to be inputted to the control circuit 19F is added in addition to the component for cancelling the magnetic flux generated in the magnetic circuit 2 due to the electric current flowing through the electric circuit 7, flows to the magnetizing coil 6. The configuration other than this point is the same as the configuration of the control circuit 19E.

The current sensor 1E can, even in the case of connecting the control circuit 19F according to the modified example 2 to the magnetizing coil 6, manage the function to measure the electric current of the electric circuit 7 and the function to open and close the electric circuit 7 in the same way as in the case of the control circuit 19E described above.

Applied Examples of Current Sensor and Control Circuit

Figure 21:
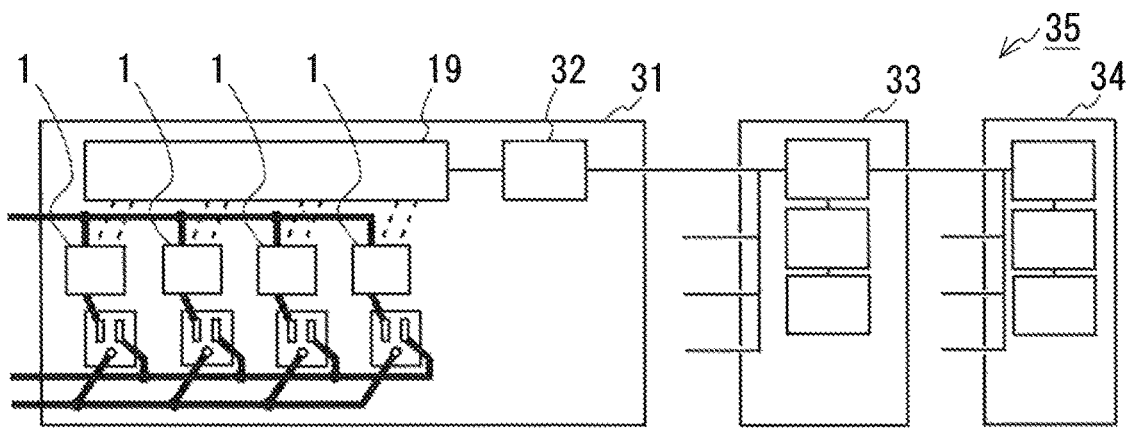
FIG. 21 is one example of a diagram illustrating an applied example of the current sensor and the control circuit according to the embodiment.

FIG. 21 is one example of a diagram illustrating applied examples of the current sensor 1 and the control circuit 19 according to the embodiment. The current sensor and the control circuit according to each of the embodiment and the modified examples can be applied to, e.g., a power distributor 31 such as a table tap and a distribution switchboard. When one single power distributor 31 is provided with a plurality of current sensors 1, the control circuits 19 to control the respective current sensors 1 may be integrated into one united circuit and may also be provided individually for the respective current sensors.

The control circuit 19 built in the power distributor 31 is connected to, e.g., an external device via a communication circuit 32 built in the power distributor 31, thereby making it possible to build up a power management system 35 to attain a cooperative operation with other devices. Namely, when desiring to aggregate power consumptions of the loads connected to the power distributor 31, for instance, communication lines connected to the communication circuit 32 of the power distributor 31 are connected to an aggregation device 34 via a relay 33 etc, thereby enabling the aggregation device 34 to aggregate the power consumptions of the respective loads. Furthermore, the power management system 35 built up by use of the power distributor 31, to which the current sensor and the control circuit according to each of the embodiment and the respective modified examples are applied, can also properly, when provided, cut off the electric power supplied to the respective loads on the side of the aggregation device 34. Moreover, data communications may be performed through digital signals by employing, e.g., AD (Analog to Digital) converter and may also be performed through analog signals remaining unconverted. When the data communications are carried out based on the digital signals, the data about the electric current may be aggregated via, e.g., an arithmetic device and a storage device.

Note that the current sensor and the control circuit according to each of the embodiment and the respective modified examples are not limited to the application to the power distributor 31 such as the table tap and the distribution switchboard. For example, when a value of the electric current of the electric circuit reaches a predetermined value, the control circuit is modified to generate the cutoff signal described above, whereby the current sensor and the control circuit according to each of the embodiment and the respective modified examples can be used as an over current relay. The embodiment and the respective modified examples can be also properly combined.

Working Example

A result of an examination about a specific design of the current sensor 1 will hereinafter be described. For example, when the electric current does not flow to the electric circuit 7, the electromagnetic force of the magnetizing coil 6 is zero. Further, for instance, it is assumed that the movable magnetic body 3 is always pulled up by the tension spring 13 by force of approximately 5.4 µN and is static at a starting point. Moreover, the magnetic circuit 2 is based on the assumption that e.g., a relative magnetic permeability is "1000", a section is 3 mm square, and a magnetic path is 36.6 mm in length. Further, the movable magnetic body 3 is based on the assumption that, e.g., the length is 20 mm, and the section is 3 mm square. Furthermore, for instance, in a state where the movable magnetic body 3 is pulled away from the fixed magnetic body 4, it is assumed that a length of the gap 9 is 1.4 mm. Moreover, for example, in a state where the movable magnetic body 3 is attracted to the fixed magnetic body 4, it is assumed that the length of the gap 9 is 0.5 mm.

For example, in the case of thus designing the current sensor 1, when the electric current of 28 A flows to the electric circuit 7, in terms of calculation, the magnetic field having the magnetic flux density of a little less than mT is generated in the magnetic circuit 2, and the electromagnetic force (corresponding to "FM1" in the graph of FIG. 5) generated in the magnetic circuit 2 becomes 2.7 µN. Supposing that the length of the gap 9 comes to 0.5 mm, the magnetic flux density of the magnetic field generated in the magnetic circuit 2 rises to 24.5 mT, and the electromagnetic force becomes 5.05 mN. In the thus-configured current sensor 1, the number of windings of the magnetizing coil 6 is set to "1000", a spring constant of the tension spring 13 is set to 11.0 mN/m, and an initial extension displacement of the tension spring 13 is set to 0.5 mm, whereby the opening/closing operation of the switch 5 can be attained by the magnetizing coil 6.

Further, on the occasion of measuring the electric current of the electric circuit 7, the magnetic field of the magnetic circuit 2 is cancelled by flowing the electric current of 28 mA at the maximum to the magnetizing coil 6 under the negative feedback control, thereby zeroing both of the magnetic flux density and the electromagnetic force. In this state, the magnetizing current flowing to the magnetizing coil 6 corresponds to a measurement target value of the electric current of the electric circuit 7. Further, the movable magnetic body 3 is always pulled up by the tension spring 13 by force of approximately 5.4 μN and is kept in the state of being pulled away from the fixed magnetic body 4.

On the occasion of switching OFF the switch 5, the magnetizing current is flowed to the magnetizing coil 6 under the positive feedback control. For example, supposing that the electric current of the electric circuit 7 is 28 A and the magnetizing current is 29 mA, the electromagnetic force (corresponding to "FM2" in the graph of FIG. 5) becomes 5.5 μN. Namely, the electromagnetic force stronger than the spring force of the tension spring 13 is generated, and hence the movable magnetic body 3 starts being attracted to the fixed magnetic body 4. As the movable magnetic body 3 is attracted to the fixed magnetic body 4, the electromagnetic force generated in the gap 9 increasingly rises. As a result, the movable magnetic body 3 reaches a point of being attracted to the fixed magnetic body 4 up to such a position as to minimize the length of the gap 9. Note that on the occasion of the actual use thereof, the magnetizing current is set to a value (e.g., 50 mA) over the theoretical value described above, thereby enabling the movable magnetic body 3 to be attracted to the fixed magnetic body 4 instantaneously.

When one single electric apparatus incorporates the current sensor to manage the function to detect the electric current and a current cutoff unit to manage the function to cut off the electric current, a space for installing components of the both is required.

Moreover, a magnetic body (e.g., ferrite is exemplified) being small both in magnetic permeability and in coercive force in order to restrain a hysteresis, is generally utilized as a magnetic body used for the current sensor. In the case of the current sensor, for example, an increase in hysteresis becomes one factor for causing a drift bias of a measurement value due to the electric current to be measured and causing a decrease in measurement accuracy. On the other hand, a magnetic body (e.g., a metal etc. is exemplified) being large both in magnetic permeability and in coercive force in order to intensify magnetism, is utilized as a magnetic body used for a magnetizing coil of a electromagnetic relay defined as one type of the current cutoff unit. Hence, one single electric apparatus incorporates the current sensor and the current cutoff unit, in which case there is required a consideration (contrivance) against the decrease in measurement accuracy of the current sensor due to extraneous noises, mutual interference between the current sensor and the current cutoff unit or the hysteresis of a member provided in the electric apparatus.

The embodiment of the present disclosure can be configured as a downsizing-enabled current sensor with a switch function.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A current sensor comprising:
a magnetic circuit to converge a magnetic flux generated from an electric circuit on a magnetic sensor;
a switch to open and close the electric circuit in a way that operates together with a movable magnetic body configuring a part of the magnetic circuit; and
a magnetizing coil to generate magnetic force enabling the movable magnetic body to be attracted to a fixed magnetic body configuring a part of the magnetic circuit,
wherein the magnetizing coil is connected to a control unit,
the magnetic circuit surrounds the electric circuit, and
the magnetic sensor is interposed between the movable magnetic body and the fixed magnetic body.

2. The current sensor according to claim 1, further comprising a biasing unit to bias a contact point of the switch in such a direction as to close the electric circuit and
wherein the control unit performs, when closing the electric circuit, negative feedback control of the magnetizing coil on the basis of a signal of the magnetic sensor and to output a control quantity of the negative feedback control as a signal proportional to the electric current of the electric circuit.

3. The current sensor according to claim 2, wherein the control unit performs, when opening the electric circuit, positive feedback control of the magnetizing coil on the basis of the signal of the magnetic sensor and causes the magnetizing coil to generate magnetic force enabling the movable magnetic body to be attracted to the fixed magnetic body.

4. The current sensor according to claim 1, further comprising a biasing unit to bias a contact point of the switch in such a direction as to open the electric circuit and
wherein the control unit performs, when closing the electric circuit, negative feedback control of the magnetizing coil on the basis of a signal with a specified electric current being superimposed on an output of the magnetic sensor and to output what a component of the specified electric current is removed from a control quantity of the negative feedback control as a signal proportional to the electric current of the electric circuit.

5. The current sensor according to claim 1, further comprising a latch unit to latch the movable magnetic body being attracted to the fixed magnetic body in a state of stopping electrification of the magnetizing coil.

6. The current sensor according to claim 2, further comprising a latch unit to latch the movable magnetic body being attracted to the fixed magnetic body in a state of stopping electrification of the magnetizing coil.

7. The current sensor according to claim 3, further comprising a latch unit to latch the movable magnetic body being attracted to the fixed magnetic body in a state of stopping electrification of the magnetizing coil.

8. The current sensor according to claim 4, further comprising a latch unit to latch the movable magnetic body being attracted to the fixed magnetic body in a state of stopping electrification of the magnetizing coil.

* * * * *